(12) United States Patent
Huang et al.

(10) Patent No.: US 7,675,357 B2
(45) Date of Patent: Mar. 9, 2010

(54) MULTI-SYSTEM MODULE HAVING FUNCTIONAL SUBSTRATE

(75) Inventors: Chung-Er Huang, Taipei (TW); Chih-Hao Liao, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 135 days.

(21) Appl. No.: 12/007,066

(22) Filed: Jan. 7, 2008

(65) Prior Publication Data

US 2009/0174463 A1   Jul. 9, 2009

(51) Int. Cl.
 *H01L 25/00* (2006.01)
(52) U.S. Cl. .......................... 327/565; 327/544; 326/41
(58) Field of Classification Search .................. None
 See application file for complete search history.

(56) References Cited

U.S. PATENT DOCUMENTS

| | | | | |
|---|---|---|---|---|
| 5,362,989 A | * | 11/1994 | Hennedy | ................... 327/544 |
| 5,744,015 A | * | 4/1998 | Mazanec et al. | ............ 204/295 |
| 5,900,763 A | * | 5/1999 | Rahim et al. | ................ 327/292 |
| 6,107,874 A | * | 8/2000 | Ohashi | ....................... 327/565 |
| 2004/0135626 A1 | * | 7/2004 | Agari et al. | ................. 327/565 |
| 2007/0029466 A1 | * | 2/2007 | Chang et al. | ............. 250/208.1 |
| 2008/0013293 A1 | * | 1/2008 | Chen et al. | ................... 361/760 |
| 2008/0265397 A1 | * | 10/2008 | Lin et al. | .................... 257/691 |
| 2009/0039479 A1 | * | 2/2009 | Huang et al. | ................ 257/664 |

* cited by examiner

*Primary Examiner*—Tuan Lam
(74) *Attorney, Agent, or Firm*—Rosenberg, Klein & Lee

(57) ABSTRACT

A multi-system module having a functional substrate includes a substrate comprising therein at least one control circuit units, and a plurality of main circuit units provided on one side surface of the substrate. The main circuit units are electrically connected to the control circuit unit, whereby the control circuit unit is used to manage the operation of the main circuit units. Via the above module structure, the substrate can improve the function of controlling multiple systems.

8 Claims, 2 Drawing Sheets

MULTI-SYSTEM MODULE HAVING FUNCTIONAL SUBSTRATE

BACKGROUND OF THE INVENTION

1. Field of the Invention

The present invention is related to a multi-system module having a functional substrate, and more particular to a multi-system module in which a control circuit unit is integrated into a substrate.

2. Description of Related Art

With the continuous development of semiconductor manufacturing technologies, the performance and quality of each module must be kept high in order to conform to the high functionality density within the housing of mobile devices. However, it is still an important issue for each manufacturer to reduce the module space while still keeping its quality high and even to enhance the performance of data transmission.

The semiconductor package technology provides a medium for connecting a silicon chip to a printed circuit board and protecting components against moisture. Although the above-mentioned function has not changed during these years, the package technology has become more complicated than before. Since the performance of a chip has changed, the package technology should be responsible to dissipate the generated heat in a safe manner while the heat will not become the limitation in the electronic performance of the desired component.

In prior art, the substrate made of- a printed circuit board (PCB) epoxy resin substrate (FR-4) or a Bismaleimide Triazine (BT) substrate can be used as a primary substrate for the module. Via a Surface Mount Technology (SMT), all of the chips, elements or other components can be adhered on the surface of the substrate. Therefore, the substrate is used as a carrier for forming a circuit connection, and the structure thereof is only used as a laminating structure for arranging the wires.

For example, in a radio-frequency system module, Wireless Local Area Networks (WLAN) can be incorporated with Bluetooth, Global Positioning System (GPS) or other systems in order to have multiple functions. As a result, it is necessary to have more and more chips and elements. If all these components of the circuit are adhered on the substrate, the volume and size of the whole module will be inevitably increased. At the same time, the number of input/output pins will increase together with the number of the systems. In order to arrange all the signal input/output pins in the substrate of a limited area, it will certainly increase the difficulty in design. A common way is to delete or decrease the input/output interface to reduce the number of pins. Alternatively, an expensive small-pitch packaging process may be used. As a result, the compatibility of the modules is reduced while the cost is increased.

Consequently, because of the above technical defects, the inventor keeps on carving unflaggingly through wholehearted experience and research to develop the present invention, which can effectively improve the defects described above.

SUMMARY OF THE INVENTION

The object of the present invention is to provide a multi-system module having a functional substrate, in which a control circuit unit is integrated into the substrate, thereby reducing the volume and size of the whole module.

For achieving the object described above, the present invention provides a multi-system module having a functional substrate, which includes: a substrate comprising therein at least one control circuit unit; and a plurality of main circuit units provided on one side surface of the substrate, wherein the main circuit units are electrically connected to the control circuit unit, whereby the control circuit unit is used to manage the operation of the main circuit units.

The present invention has advantageous effects as follows. The present invention provides a multi-system module having a functional module. The substrate having a control circuit unit for controlling a circuit is used, thereby managing and controlling one or more, systems in the module. Therefore, the multi-system module provided by the present invention can perform the controlling for multi-systems.

In order to further understand the characteristics and technical contents of the present invention, a detailed description is made with reference to the accompanying drawings. However, it should be understood that the drawings are illustrative only but not used to limit the present invention thereto.

DETAILED DESCRIPTION OF THE PREFERRED EMBODIMENTS

Figure 1:
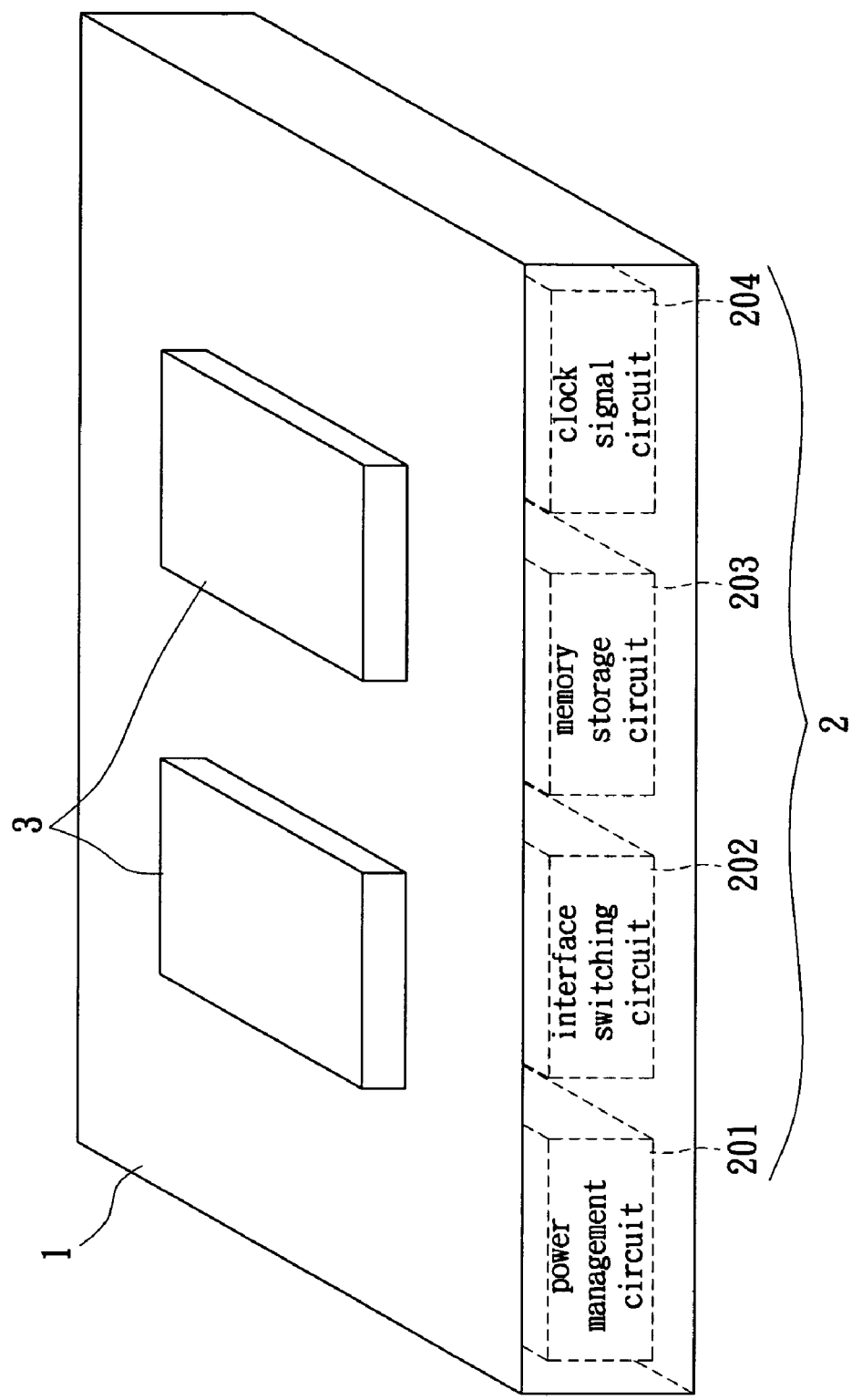
FIG. 1 is a schematic view showing a multi-system module having a functional substrate in accordance with the present invention.

Please refer to FIG. 1, which is a schematic view showing a multi-system module having a functional substrate in accordance with the present invention. As shown in this figure, the present invention provides a multi-system module having a functional substrate, which includes a substrate 1, at least one control circuit unit 2 and a plurality of main circuit units 3. The substrate 1 can be a silicon chip. The control circuit unit 2 is integrated into the silicon chip substrate 1 via a semiconductor process. The main circuit units 3 are adhered on the surface of the silicon chip substrate 1 via a Surface Mount Technology (SMT), and are electrically connected to the control circuit unit 2 integrated into the silicon chip substrate 1, thereby transmitting the signals one another. In this way, the control circuit unit 2 manages the operation of one or more main circuit units 3.

In addition to a power management circuit 201, interface switching circuit 202, memory storage circuit 203 and clock signal circuit 204 illustrated in FIG. 1, the above-mentioned control circuit unit 2 can have impedance matching circuit, filter capacitor circuit, voltage switching circuit and antenna phase switching circuit etc., but are not limited thereto.

Figure 2A:
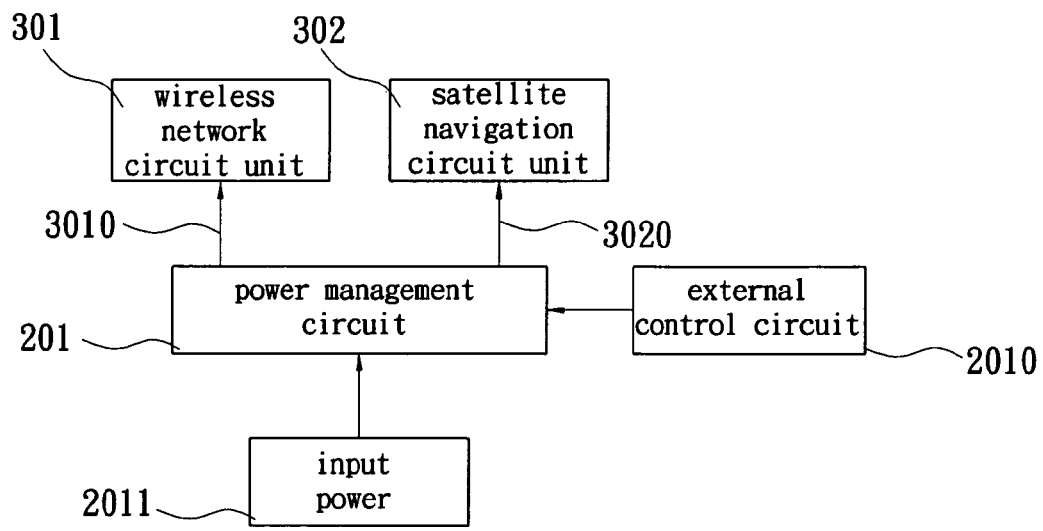
FIG. 2A is a schematic view showing a multi-system module having a functional substrate in accordance with the first embodiment of the present invention.

In order to describe the actual connection and operation of the control circuit unit 2 and the main circuit units 3, please refer to FIG. 2A. The main circuit units 3 can be a wireless network circuit unit 301 and a satellite navigation circuit unit 302. As shown in this figure, when one power management circuit 201 in the control circuit unit 2 intends to provide the power to the wireless network circuit unit 301 and the satellite navigation circuit unit 302, in the present embodiment, the input power 3010 in the wireless network circuit unit 301 and the input power 3020 in the satellite navigation circuit unit 302 are connected to the power management circuit 201. An external control signal 2010 is used to control the input power mode (such as a normal mode, standby mode, shut-off mode) provided in the wireless network circuit unit 301 and the satellite navigation circuit unit 302, thereby achieving the highest efficiency in using the power. Furthermore, the power management circuit 201 only needs one input power 2011 to provide the necessary power for multiple main circuit units 3. Therefore, the number of the pins can be reduced. That is to say, the power management circuit 201 can be used to control an external signal (such as the above-mentioned input power), and the external signal outputs the signals of different modes based on the demands of different main circuit units 3, thereby controlling the main circuit units 3.

Figure 2B:
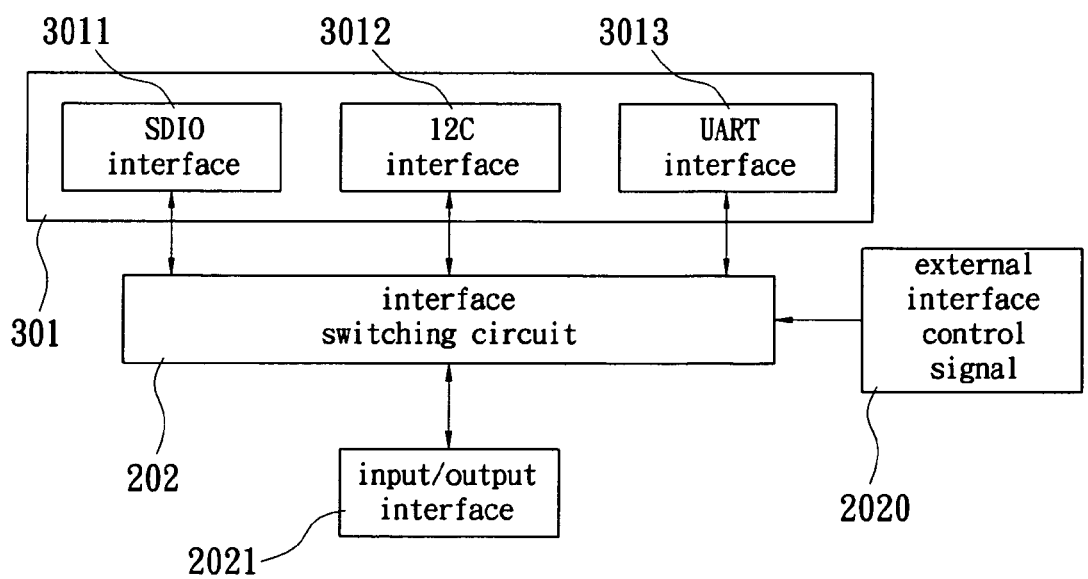
FIG. 2B is a schematic view showing a multi-system module having a functional substrate in accordance with the second embodiment of the present invention.

Please refer to FIG. 2 B, which is block showing the connecting structure between the interface switching circuit 202 and the wireless network circuit unit 301. As shown in this figure, in the present embodiment, a SDIO interface 3011, 12C interface 3012 and UART interface 3013 in the wireless network circuit unit 301 are connected to the interface switching circuit 202. An external interface control signal 2020 is used to selectively connect to an external input/output interface 2021, thereby reducing the number of the input/output pins. That is to say, when the main circuit units output a plurality of interface signals (such as the above-mentioned SDIO interface signals, 12C interface signals or the like), the interface signals can output single interface signal via the control circuit unit 2, thereby reducing the number of the connecting terminals.

In order to correspond to the module designs of various fields, the control circuit is not limited to the above types, and one or more of them can be selected for the desired application. Further, the type of the control circuit is not used to limit the scope of the present invention.

In the present invention, since the control circuit unit 2 is integrated into the silicon chip substrate 1 first via a semiconductor process, the wiring layout between the main circuit unit 3 and the control circuit unit 2 can be achieved by means of a redistribution layer (RDL) technology. In this way, with adjusting the input/output positions of elements, the main circuit unit 3 adhered on the silicon chip substrate 1 and the control circuit unit 2 integrated into the silicon chip substrate 1 can complete the circuit connection between the main circuit unit 3 and the control circuit unit 2 and enhance the quality and steadiness of the signals among the elements.

Incidentally, the above-mentioned semiconductor process can be a series of processing steps starting from a silicon wafer, including photo developing, rapid high-temperature process, chemical vapor depositing, ion implanting, etching or the like to stack up the functional silicon chip substrates 1 that has a circuit and is used in the present invention.

According to the above, the present invention has advantageous effects as follows.

(1) Improving the Circuit Property of the Module

With the present invention, the control circuit unit can be arranged to be very close to the main circuit unit, so that the signal decay occurring in wires of long distance can be prevented, thereby improving the circuit property of the module greatly.

(2) Reducing the Temperature of the Module

Since the silicon chip substrate has a good thermal conductivity, the silicon chip substrate can reduce the temperature generated by the whole module efficiently.

(3) Reducing the Cost

Since a portion or all of the control circuit units have been integrated into the silicon chip substrate and the silicon chip substrate has a larger area, it is not necessary to use a high-level process. Further, all the control circuit units can be achieved in the silicon chip substrate by manes of the same low-level process (such as 0.5 micron process), thereby reducing the cost greatly.

(5) Reducing the Number of Input/Output Pins

Since the functional substrate can integrate the interface switching circuit with the power management circuit, a plurality of interfaces can be integrated in an external interface. As a result, only one power input is needed, so that the number of the pins of the module can be reduced without sacrificing the compatibility of the interface. Further, a package technology of low cost can be used.

(5) Improving Power Efficiency

Since the functional substrate can integrate the power management circuit, it is able to provide and manage the power supply for multiple systems collectively, thereby reducing the loss caused by quiescent current.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multi-system module having a functional substrate, comprising;
   a substrate comprising therein at one or more control circuit units; and
   a plurality of main circuit units provided on one side surface of the substrate, wherein the main circuit units are electrically connected to the control circuit units,
   whereby the control circuit unit is used to manage the operation of the main circuit units;
   wherein when an external signal is inputted into the multi-system module having a functional substrate, the external signal controls the main circuit units based on signals of different modes outputted by the control circuit unit.

2. The multi-system module having a functional substrate according to claim 1, wherein the substrate is a silicon chip substrate.

3. The multi-system module having a functional substrate according to claim 1, wherein the control circuit units are one or several of the following: a power management circuit, a interface switching circuit, a memory storage circuit, a clock signal circuit, an impedance matching circuit, a filter capacitor circuit ad a antenna phase switching circuit.

4. The multi-system module having a functional substrate according to claim 1, wherein the main circuit units are connected with the control circuit unit via a redistribution layer process.

5. The multi-system module having a functional substrate according to claim 1, wherein the main circuit units are provided on a side surface of the substrate via a Surface Mount Technology.

6. The multi-system module having a functional substrate according to claim 1, wherein the control circuit unit is formed in the substrate via a semiconductor process.

7. The multi-system module having a functional substrate according to claim 1, wherein the external signal is the input power, the control circuit unit outputs power signals of different modes to control the main circuit units.

8. A multi-system module having a functional substrate, comprising:
   a substrate comprising therein at one or more control circuit units; and
   a plurality of main circuit units provided on one side surface of the substrate, wherein the main circuit units are electrically connected to the control circuit units, whereby the control circuit unit is used to manage the operation of the main circuit units; wherein when the main circuit units output a plurality of interface signals, the interface signals are single interface signals outputted via the control circuit unit.

* * * * *